(12) United States Patent
Kosuda et al.

(10) Patent No.: US 7,939,221 B2
(45) Date of Patent: May 10, 2011

(54) HOLOGRAM RECORDING MATERIAL, PROCESS FOR PRODUCING THE SAME AND HOLOGRAM RECORDING MEDIUM

(75) Inventors: Atsuko Kosuda, Tokyo (JP); Naoki Hayashida, Tokyo (JP); Jiro Yoshinari, Tokyo (JP)

(73) Assignee: TDK Corporation, Tokyo (JP)

( * ) Notice: Subject to any disclaimer, the term of this patent is extended or adjusted under 35 U.S.C. 154(b) by 608 days.

(21) Appl. No.: 12/021,686

(22) Filed: Jan. 29, 2008

(65) Prior Publication Data

US 2008/0193857 A1   Aug. 14, 2008

(30) Foreign Application Priority Data

Feb. 9, 2007   (JP) ................. 2007-031095

(51) Int. Cl.
*G03H 1/02* (2006.01)
*G03C 1/735* (2006.01)
(52) U.S. Cl. .......... 430/1; 430/2; 430/280.1; 430/281.1; 359/3; 65/395
(58) Field of Classification Search .................. None
See application file for complete search history.

(56) References Cited

U.S. PATENT DOCUMENTS

| | | | |
|---|---|---|---|
| 5,234,870 A * | 8/1993 | Osaka et al. ............. 501/12 |
| 6,268,089 B1 | 7/2001 | Chandross et al. | |
| 6,479,193 B1 | 11/2002 | Maeda et al. | |
| 6,524,771 B2 | 2/2003 | Maeda et al. | |
| 6,987,197 B2 * | 1/2006 | Okamura et al. .......... 556/40 |
| 2002/0110740 A1 | 8/2002 | Otaki et al. | |
| 2006/0172203 A1 | 8/2006 | Mizushima | |
| 2007/0095736 A1 * | 5/2007 | Malik et al. ............. 210/198.2 |
| 2007/0111107 A1 | 5/2007 | Yoshinari et al. | |
| 2007/0111108 A1 | 5/2007 | Hayashida et al. | |
| 2007/0243473 A1 | 10/2007 | Mizushima et al. | |

(Continued)

FOREIGN PATENT DOCUMENTS

GB  2330145  *  4/1999

(Continued)

OTHER PUBLICATIONS

Zhan et al. "A catalyst free approach for sol-gel synthesis of highly mixed ZrO2-SiO2 oxides", J. non-cryst. Sol. vol. 243 pp. 26-38 (1999).*

(Continued)

*Primary Examiner* — Martin J Angebranndt
(74) *Attorney, Agent, or Firm* — Oblon, Spivak, McClelland, Maier & Neustadt, L.L.P.

(57) ABSTRACT

The present invention provides a hologram recording material which is suitable for volume hologram record and attains high refractive index change, flexibility, high sensitivity, low scattering, environment resistance, durability, low shrinkage and high multiplicity in holographic memory record using not only a green laser but also a blue laser; a process for producing the same; and a hologram recording medium having the hologram recording material. A hologram recording material comprising: a metal oxide containing at least Si and Zr as metals wherein a β-dicarbonyl compound is coordinated to Zr; and a photopolymerizable compound, wherein a mole ratio of the β-dicarbonyl compound to the Zr atom (β-dicarbonyl compound/Zr ratio) is 2/1 or more and 3/1 or less, and a mole ratio of the Si atom to the Zr atom (Si/Zr ratio) is more than 1/1 and 1.15/1 or less in the metal oxide. A hologram recording medium (11) comprising the hologram recording material layer (21).

11 Claims, 2 Drawing Sheets

U.S. PATENT DOCUMENTS

| | | |
|---|---|---|
| 2007/0243474 A1 | 10/2007 | Mizushima et al. |
| 2008/0057404 A1 | 3/2008 | Kosuda et al. |
| 2008/0057405 A1 | 3/2008 | Yoshinari et al. |
| 2008/0057406 A1 | 3/2008 | Hayashida et al. |
| 2008/0076033 A1 | 3/2008 | Hayashida et al. |
| 2008/0145307 A1 | 6/2008 | Kosuda et al. |
| 2008/0160421 A1 | 7/2008 | Hayashida et al. |
| 2008/0254375 A1 | 10/2008 | Hayashida et al. |
| 2008/0268349 A1 | 10/2008 | Kosuda et al. |
| 2009/0091810 A1 | 4/2009 | Yoshinari et al. |
| 2009/0092904 A1 | 4/2009 | Hayashida et al. |
| 2009/0097085 A1 | 4/2009 | Hayashida et al. |
| 2009/0186281 A1 | 7/2009 | Kosuda et al. |
| 2010/0086859 A1 | 4/2010 | Hayashida et al. |

FOREIGN PATENT DOCUMENTS

| | | | |
|---|---|---|---|
| JP | 04-306275 | * | 10/1992 |
| JP | 6-148880 | | 5/1994 |
| JP | 2953200 | | 7/1999 |
| JP | 11-344917 | | 12/1999 |
| JP | 2002-236439 | | 8/2002 |
| JP | 2002-236440 | | 8/2002 |
| JP | 2003-43903 | | 2/2003 |
| JP | 2005-321673 | * | 11/2005 |
| JP | 2005-321674 | | 11/2005 |

OTHER PUBLICATIONS

Nacken et al. "formation and hydrolytic stability of oxygen bridged heterometal bonds (Si-O-Ti, Si-O-Zr,Si-O-Ta) in sol-gel materials" Mat. Res. Soc. Symp. Proc. 576 pp. 221-226 (1999).*

T. Shimura, "Holographic Memory", O plus E, vol. 25, No. 4, 2003, pp. 385-390.

* cited by examiner

HOLOGRAM RECORDING MATERIAL, PROCESS FOR PRODUCING THE SAME AND HOLOGRAM RECORDING MEDIUM

BACKGROUND OF THE INVENTION

1. Field of the Invention

The present invention relates to a hologram recording material suitable for volume hologram recording, a process for producing the same, and a hologram recording medium having the hologram recording material. The present invention relates in particular to a hologram recording material suitable for record and reproduction using not only a green laser light but also a blue laser light, a process for producing the same, and a hologram recording medium having the hologram recording material.

2. Disclosure of the Related Art

Research and development of holographic memories have been advanced as large-capacity recording technique making high-speed transmission possible. O plus E, vol. 25, No. 4, 385-390 (2003) describes basic structures of holographic memories and a coming prospect thereof.

Examples of the property required for a hologram recording material include high refractive index change at the time of recording, high sensitivity, low scattering, environment resistance, durability, low dimensional change, and high multiplicity. About holographic memory record using a green laser, various reports have been made hitherto as follows.

As a hologram recording material, there is known a photopolymer material made mainly of an organic binder polymer and a photopolymerizable monomer. However, the photopolymer material has problems about environment resistance, durability and others. In order to solve the problems of the photopolymer material, attention has been paid to an organic-inorganic hybrid material made mainly of an inorganic matrix and a photopolymerizable monomer, and the hybrid material has been investigated. The inorganic matrix is excellent in environment resistance and durability.

For example, Japanese Patent No. 2953200 discloses a film for optical recording wherein a photopolymerizable monomer or oligomer and a photopolymerization initiator are contained in an inorganic substance network film. It is also disclosed that the brittleness of the inorganic network film is improved by modifying the inorganic network organically. However, the compatibility between the inorganic substance network and the photopolymerizable monomer or oligomer is bad. Therefore, a uniform film is not easily obtained. A specific disclosure of the publication is that a photosensitive layer having a thickness of about 10 μm (par. [0058]) is exposed to an argon laser having a wavelength of 514.5 nm (par. [0059]).

JP-A-11-344917 discloses an optical recording medium wherein an organic-inorganic hybrid matrix contains an optically active monomer. In the organic-inorganic hybrid matrix, a metal element has an alkyl group (a methyl group) or an aryl group (a phenyl group). However, the introduction of the methyl group makes it impossible to improve the compatibility between the hybrid matrix and the optically active monomer. The introduction of the phenyl group gives a more improvement in the compatibility than the introduction of the methyl group. However, the introduction of the phenyl group causes a fall in the curing speed of a hybrid matrix precursor ([0015] in the above publication). A specific disclosure of the publication is that record is made in a hologram recording layer having a thickness of 100 μm, using a YAG laser having a wavelength of 532 nm (Example, [0031]).

JP-A-2002-236439 discloses a hologram recording material comprising: a matrix made of an organic-inorganic hybrid polymer obtained by copolymerizing an organometallic compound containing an ethylenically unsaturated double bond and an organic monomer having an ethylenically unsaturated double bond, as main chain constituting components, and/or a hydrolyzed polycondensate thereof; a photopolymerizable compound; and a photopolymerization initiator. By the introduction of the large organic main chain component into the matrix material, the compatibility between the matrix and the photopolymerizable compound is improved. However, the introduction of the large organic main chain component permits the presence of a two-component structure of the organic main chain and an inorganic network in the matrix material. Thus, it appears that the matrix may not exhibit unified behavior at the time of recording so as to cause nonuniform recording. If the ratio of the organic main chain component in the matrix is large, the same problems as in the case of the above-mentioned photopolymer material, which uses an organic binder polymer, are caused. A specific disclosure of the publication is that a hologram recording material layer having a thickness of 20 μm (par. [0080]) is exposed to an argon laser having a wavelength of 514.5 nm (par. [0081]).

In order to solve the problems of the hologram recording materials disclosed in the above-mentioned individual publications, JP-A-2005-321674 discloses a hologram recording material comprising: an organometallic compound at least containing at least two kinds of metals (Si and Ti), oxygen, and an aromatic group, and having an organometallic unit wherein two aromatic groups are directly bonded to one metal (Si); and a photopolymerizable compound. In Example 1 of the publication (in particular, pars. [0074] to [0078]), it is disclosed that a hologram recording medium which has a layer of the above-mentioned hologram recording material having a thickness of 100 μm gave a high transmittance, a high refractive index change, a low scattering, and a high multiplicity in record using a Nd:YAG laser (532 nm).

SUMMARY OF THE INVENTION

Any of the above-mentioned publications disclose holographic memory record using a green laser, but do not disclose holographic memory record using a blue laser.

An object of the present invention is to provide a hologram recording material which is suitable for volume hologram record and can attain high refractive index change, flexibility, high sensitivity, low scattering, environment resistance, durability, low dimensional change (low shrinkage) and high multiplicity in holographic memory record using not only a green laser but also a blue laser; and to provide a process for producing the a hologram recording material. And, an object of the present invention is to provide a hologram recording medium which has a hologram recording layer comprising the hologram recording material.

The present inventors have made investigations, so as to find out that when a blue laser is used to make a holographic memory record in the hologram recording medium disclosed in JP-A-2005-321674, the transmittance thereof falls so that good holographic memory recording characteristics cannot be obtained. It has also been understood that the fall in the transmittance results from a matter that the recording layer of the medium contains Ti as a constituent metallic element thereof. When a transmittance falls, holograms (interference fringes) are unevenly formed in the recording layer along the thickness direction of the recording layer so that scattering-based noises and the like are generated. It has been found out that in order to obtain good hologram image characteristics, it is necessary that the medium has a light transmittance of 50% or more.

A light transmittance of a hologram recording layer depends on a thickness thereof. As the thickness of the recording layer is made smaller, the light transmittance is improved; however, the widths of diffraction peaks obtained when reproducing light is irradiated into a recorded pattern become larger so that separability between adjacent diffraction peaks deteriorates. Accordingly, in order to obtain a sufficient SN ratio (Signal to Noise ratio), it is indispensable to make a shift interval (an angle or the like) large when multiple record is made. For this reason, a high multiplicity cannot be attained. In the use of a hologram recording medium in any recording system, the thickness of its recording layer is required to be at lowest 100 μm in order to attain holographic memory recording characteristics for ensuring a high multiplicity.

The present inventors have suggested in Japanese Patent Application No. 2006-238357 (filed on Sep. 1, 2006):
"A hologram recording material comprising:
a metal oxide comprising Si and at least one selected from the group consisting of Ta and Zr, as metals, wherein a complexing ligand is coordinated to Ta and/or Zr; and
a photopolymerizable compound".

The above Japanese Patent Application is not open to the public when the present application is filed. The complexing ligand is selected from the group consisting of, for example, β-dicarbonyl compounds, polyhydroxylated ligands, and α- or β-hydroxyacids.

The present inventors have made further investigations to find out a hologram recording material which has a higher light transmissivity to a blue laser and gives a high sensitivity and a high multiplicity.

The present invention includes the followings:
(1) A hologram recording material comprising:
a metal oxide containing at least Si and Zr as metals wherein a β-dicarbonyl compound is coordinated to Zr; and
a photopolymerizable compound,
wherein a mole ratio of the β-dicarbonyl compound to the Zr atom (β-dicarbonyl compound/Zr ratio) is 2/1 or more and 3/1 or less, and a mole ratio of the Si atom to the Zr atom (Si/Zr ratio) is more than 1/1 and 1.15/1 or less in the metal oxide.
(2) The hologram recording material according to the above-described (1), wherein the metal oxide has an organometallic unit in which two aromatic groups are directly bonded to Si.
(3) The hologram recording material according to the above-described (1) or (2), which further comprises a photopolymerization initiator.
(4) A process for producing a hologram recording material comprising:
a metal oxide containing at least Si and Zr as metals wherein a β-dicarbonyl compound is coordinated to Zr; and
a photopolymerizable compound,
the process comprising:
mixing an alkoxide compound of Zr as a starting material with a β-dicarbonyl compound to set a mole ratio of the β-dicarbonyl compound to the Zr atom (β-dicarbonyl compound/Zr ratio) to 2/1 or more and 3/1 or less, thereby modifying the alkoxide compound of Zr with the β-dicarbonyl compound;
mixing the alkoxide compound of Zr modified with the β-dicarbonyl compound with an alkoxide compound of Si to set a mole ratio of the Si atom to the Zr atom (Si/Zr ratio) to more than 1/1 and 1.15/1 or less;
hydrolyzing the mixed alkoxide compounds to yield a precursor of a metal oxide;
incorporating a photopolymerizable compound into the resultant system before, during or after the hydrolysis; and
advancing a polycondensation reaction of the metal oxide precursor into which the photopolymerizable compound is incorporated.
(5) The process for producing the hologram recording material according to the above-described (4), wherein the alkoxide compound of Zr as the starting material is a Zr alkoxide compound represented by:

$$Zr(OR)_n \qquad (I)$$

wherein R's are each a linear saturated alkyl group having 3 to 4 carbon atoms, and n is 4.
(6) A hologram recording medium having a hologram recording layer comprising the hologram recording material according to any one of the above-described (1) to (3), or the hologram recording material obtained by the producing process according to the above-described (4) or (5).
(7) The hologram recording medium according to the above-described (6), wherein record/reproduction of said hologram recording medium are performed using a laser light having a wavelength of 350 to 450 nm.
(8) The hologram recording medium according to the above-described (6) or (7), wherein said hologram recording medium has a light transmittance of 50% or more at a wavelength of 405 nm, or has a light reflectance of 25% or more at a wavelength of 405 nm.
(9) The hologram recording medium according to any one of the above-described (6) to (8), wherein the hologram recording layer has a thickness of at least 0.1 mm (100 μm).

According to the hologram recording material of the present invention, the organic group-containing metal oxide, which functions as a matrix or a dispersing medium for the photopolymerizable compound, contains Si and Zr as constituent metallic elements, and a β-dicarbonyl compound as a complexing ligand is coordinated to Zr; therefore, the material is in a very even (or homogeneous) form, and less absorbs light having a wavelength in the blue wavelength region than materials containing Ti as a constituent metallic element.

Additionally, according to the hologram recording material of the present invention, in the metal oxide, the mole ratio of the β-dicarbonyl compound to the Zr atom (β-dicarbonyl compound/Zr ratio) is 2/1 or more and 3/1 or less and the mole ratio of the Si atom to the Zr atom (Si/Zr ratio) is more than 1/1 and 1.15/1 or less; therefore, the material very slightly absorbs light having a wavelength in the blue wavelength region. For this reason, using the hologram recording material of the present invention, provided is a hologram recording medium which has a higher light transmissivity to a blue laser and gives a high sensitivity and a high multiplicity in recording/reproducing using not only a green laser light but also a blue laser light.

DETAILED DESCRIPTION OF THE INVENTION

Figure 1:
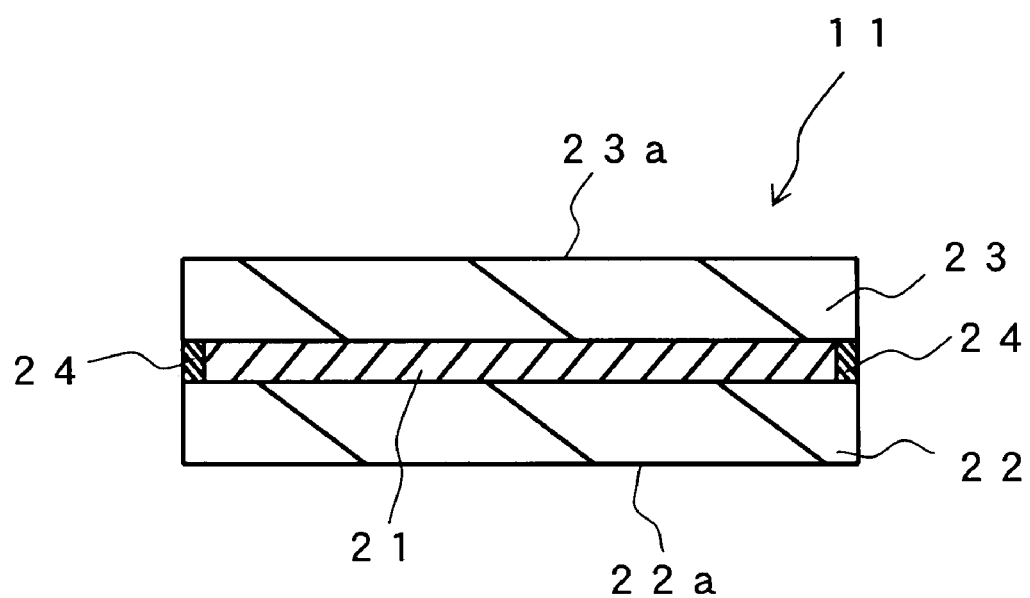
FIG. 1 is a view illustrating a schematic cross section of a hologram recording medium produced in the example.

The hologram recording material of the present invention is a composition containing the following as essential components: an organic group-containing metal oxide containing, as metals, at least Si and Zr at a specified ratio wherein a β-dicarbonyl compound as a complexing ligand is coordinated to Zr at a specified ratio; and a photopolymerizable compound. The hologram recording material is made into a film form, thereby preparing a hologram recording material layer. Any optional metal other than Si and Zr may be further used. However, it is preferred not to use Ti. The incorporation of the two or more kinds of metals as constituent elements into the material makes the control of characteristics of the material, such as the refractive index, easy. This is preferred for the design of the recording material.

The organic group-containing metal oxide is obtained by subjecting an alkoxide compound of Zr which is modified with a β-dicarbonyl compound as a complexing ligand and a corresponding alkoxide compound of Si to hydrolysis and polymerization reaction (the so-called sol-gel reaction). The metal oxide is in a very even gel or sol form. The organic group-containing metal oxide functions as a matrix or a dispersing medium for the photopolymerizable compound in the hologram recording material layer. In other words, the photopolymerizable compound in a liquid phase is evenly dispersed with a good compatibility in the organic group-containing metal oxide in a gel- or sol-form.

When light having coherency is irradiated onto the hologram recording material layer, the photopolymerizable organic compound (monomer) undergoes polymerization reaction in the exposed portion so as to be polymerized, and further the photopolymerizable organic compound diffuses and shifts from the unexposed portion into the exposed portion so that the polymerization of the exposed portion further advances. As a result, an area where the polymer produced from the photopolymerizable organic compound is large in amount and an area where the polymer is small in amount are formed in accordance with the intensity distribution of the light. At this time, the organic group-containing metal oxide shifts from the area where the polymer is large in amount to the area where the polymer is small in amount, so that the area where the polymer is large in amount becomes an area where the metal oxide is small in amount and the area where the polymer is small in amount becomes an area where the metal oxide is large in amount. In this way, the light exposure causes the formation of the area where the polymer is large in amount and the area where the metal oxide is large in amount. When a refractive index difference exists between the polymer and the metal oxide, a refractive index change is recorded in accordance with the light intensity distribution.

In order to obtain a better recording property in the hologram recording material, it is necessary that a difference is large between the refractive index of the polymer produced from the photopolymerizable compound and that of the metal oxide. The refractive indexes of the polymer and the metal oxide may be designed so as to make any one of the refractive indexes high (or low).

In the case of using a large amount of Si, a design for making a refractive index of the metal oxide low is supposed. In the present invention, however, the metal oxide contains Zr as essential constituent element thereof, therefore, a high refractive index of the metal oxide can be obtained. Accordingly, it is advisable to design the hologram recording material so as to cause the metal oxide to have a high refractive index and cause the polymer to have a low refractive index.

In the present invention, a β-dicarbonyl compound as a complexing ligand is coordinated to at least one portion of the Zr atoms which constitute the metal oxide. The mole ratio of the β-dicarbonyl compound to the Zr atom (β-dicarbonyl compound/Zr ratio) is 2/1 or more and 3/1 or less. Examples of the β-dicarbonyl compound include β-diketones such as acetylacetone (AcAc) and benzoylacetone; and β-ketoesters such as ethyl acetoacetate (EtAcAc).

When a mixture of the alkoxide compound of Zr and the alkoxide compound of Si is subjected to a sol-gel reaction, the alkoxide compound of Si is generally small in rates of hydrolysis and polymerization reaction and the alkoxide compound of Zr is large in rates of hydrolysis and polymerization reaction. As a result, an oxide of Zr aggregates so that a homogeneous sol-gel reaction product cannot be obtained. The present inventors have made investigations to find out that in the case of modifying an alkoxide compound of Zr chemically with a β-dicarbonyl compound by coordinating the β-dicarbonyl compound to the Zr alkoxide compound to set the mole ratio of the β-dicarbonyl compound to the Zr atom (β-dicarbonyl compound/Zr ratio) into the above-mentioned specified range, the hydrolysis and polymerization reaction thereof can be appropriately restrained (or controlled) to yield a homogeneous sol-gel reaction product from a mixture of the Zr alkoxide compound with an alkoxide compound of Si.

In the present invention, a β-dicarbonyl compound is coordinated to an alkoxide compound of Zr to set the mole ratio of the β-dicarbonyl compound to the Zr atom (β-dicarbonyl compound/Zr ratio) to 2/1 or more and 3/1 or less, for example, more than 2/1 and 3/1 or less before sol-gel reaction thereof. In other words, a β-dicarbonyl compound is coordinated to a Zr alkoxide compound: $Zr(OR)_4$ wherein R's are each an alkyl group so that, in the case of, e.g., acetylacetone (AcAc) as the β-dicarbonyl compound, the molecules of the Zr alkoxide compound change to a mixture of Zr compounds, such as a cluster containing several Zr atoms, $Zr(OR)_3$(AcAc), $Zr(OR)_2(AcAc)_2$ or $Zr(OR)(AcAc)_3$. As a result, the number of the alkoxy groups which can contribute to hydrolysis and polymerization reaction decreases, and further the reactivity of the alkoxy groups is restrained by a steric factor of the complexing ligand such as acetylacetone (AcAc). These matters would restrain the hydrolysis and polymerization reaction appropriately.

If the mole ratio of the β-dicarbonyl compound/Zr is less than 2/1, the amount of the β-dicarbonyl compound is made small and the rates of hydrolysis and polymerization reaction of the Zr alkoxide compound become large considering the above-mentioned reaction restraining effect. As a result, a homogeneous sol-gel reaction product is not easily obtained in the coexistence of a Si alkoxide compound. Thus, a high sensitivity and a high multiplicity of the hologram recording medium are not easily attained.

On the other hand, if the mole ratio of the β-dicarbonyl compound/Zr is more than 3/1, the amount of the β-dicarbonyl compound is excessive so that the rates of hydrolysis and polymerization reaction of the Zr alkoxide compound are excessively restrained. Thus, the curing of the sol-gel reaction product does not advance easily. Additionally, the amount of the β-dicarbonyl compound contained in the metal oxide matrix increases, so that the refractive index of the metal oxide matrix falls. Thus, a high sensitivity and a high multiplicity of the hologram recording medium are not easily attained.

It is preferred to coordinate the β-dicarbonyl compound to the Zr alkoxide compound to set the mole ratio of the β-dicarbonyl compound to the Zr atom (β-dicarbonyl compound/Zr ratio) into the range of 2.2/1 to 2.8/1.

The Zr alkoxide compound as the starting material is not limited, but is preferably a Zr alkoxide compound represented by:

$$Zr(OR)n \hspace{4em} (I)$$

wherein R's are each a linear saturated alkyl group having 3 to 4 carbon atoms, and n is 4. Four R's may be the same or different. Specific examples thereof include tetra-n-propoxyzirconium, and tetra-n-butoxyzirconium. The Zr alkoxide compound, which has a linear saturated alkoxide group, is preferred since the compound is smaller in steric hindrance than Zr alkoxide compounds having a branched alkoxide group so that the β-dicarbonyl compound is more easily coordinated thereto. However, tetra-iso-propoxyzirconium, tetra-tert-butoxyzirconium or the like may be used.

As described above, in the metal oxide in the present invention, the mole ratio of the β-dicarbonyl compound to the Zr atom (β-dicarbonyl compound/Zr ratio) is 2/1 or more and 3/1 or less and further the mole ratio of the Si atom to the Zr atom (Si/Zr ratio) is more than 1/1 and 1.15/1 or less, for example, 1.01/1 or more and 1.15/1 or less. In order to obtain such a mole ratio of Si/Zr, it is advisable to use a Zr alkoxide compound and a Si alkoxide compound as starting materials so as to give the mole ratio of Si/Zr.

If the mole ratio of Si/Zr is 1/1 or less, the amount of the Zr alkoxide compound is excessive large in respect to that of the Si alkoxide compound so that a homogeneous sol-gel reaction product is not easily obtained in the coexistence of a Si alkoxide compound. For this reason, a high sensitivity and a high multiplicity of the hologram recording medium are not easily attained.

On the other hand, if the mole ratio of Si/Zr is more than 1.15/1, the amount of the Zr alkoxide compound is excessively small in respect to that of the Si alkoxide compound so that the curing of the sol-gel reaction product does not advance easily. Additionally, the ratio of Zr in the metal oxide matrix falls so that the refractive index of the metal oxide matrix falls. For this reason, a high sensitivity and a high multiplicity of the hologram recording medium are not easily attained.

When the mole ratio of the Si atom to the Zr atom (Si/Zr ratio) is set to more than 1/1 and 1.15/1 or less, the refractive index of the metal oxide matrix is easily controlled into a desired value and a homogeneous sol-gel reaction product is easily obtained. The mole ratio of Si/Zr is preferably 1.05/1 or more and 1.1/1 or less.

In this way, the organic group-containing metal oxide in the present invention is in a very even gel or sol form. The organic group-containing metal oxide considerably less absorbs light having a wavelength in the blue wavelength region than oxide materials containing Ti as a constituent metal element thereof.

In the organic group-containing metal oxide, the metal atoms (the same metal atoms and the different metal atoms) are bonded to each other through an oxygen atom interposed therebetween. For the purposes such as to obtain a desired refractive index in the present invention, the metal oxide may contain any optional metal(s) other than Si and Zr, for example, metal(s) selected arbitrarily from Ta, Ge, Sn, Al and Zn, in such an amount that the high sensitivity and the high multiplicity of the hologram recording medium are not damaged.

In the present invention, a preferred organic group-containing metal oxide which has flexibility will be described hereinafter.

In the present invention, in order to obtain a much better recording property in the hologram recording material, it is necessary that the diffusion/polymerization of the photopolymerizable compound is easily attained in the state that the photopolymerizable compound is present together with the organic group-containing metal oxide. If the organic group-containing metal oxide has flexibility, it functions as a matrix or a dispersing medium for the photopolymerizable compound so that the diffusion/polymerization of the photopolymerizable compound is easily attained. Thus, the refractive index change between the exposed portion and the unexposed portion becomes larger by irradiation of light.

In the present invention, the preferred organic group-containing metal oxide contains Si and Zr as metals (M), contains a β-dicarbonyl compound coordinated to Zr, and further contains an organometallic unit (Ar—Si—Ar), wherein two aromatic groups (Ar) are directly bonded to Si. Alternatively, the metal oxide may further contain, as metals (M), any optional metal other than Si and Zr (provided that Ti is not contained), and further contains an organometallic unit (Ar-M-Ar), wherein two aromatic groups (Ar) are directly bonded to the optional metal (M). The metal oxide having such an organometallic unit has flexibility.

In order to introduce the organometallic unit (Ar-M-Ar) into the metal oxide, it is advisable to use a diarylalkoxide compound of the metal (M), which constitutes the organometallic unit, in the sol-gel reaction.

The diarylalkoxide compound of Si as a starting material is available at ease. Examples of the diarylalkoxide compound of Si include diphenyldimethoxysilane, and diphenyldimethoxysilane. However, it is not excluded that aromatic groups are bonded directly to the metal other than Si.

It is more preferred that the organometallic unit (Ar—Si—Ar) is a unit (Ph-Si-Ph) wherein two phenyl groups (Ph) are bonded directly to one Si atom. The diphneylalkoxide compound of Si as a starting material is available at ease, and the compound is good in reactivity for hydrolysis and polymerization. The phenyl groups may have a substituent.

The preferred organic group-containing metal oxide has an organometallic unit wherein two aromatic groups are bonded directly to one metal. Besides the organometallic unit, the organometallic compound may have an organometallic unit wherein one aromatic group is bonded directly to one metal, or may have an organometallic unit wherein three aromatic groups are bonded directly to one metal.

According to the introduction of the two aromatic groups (phenyl groups) into Si, the organometallic compound has good compatibility with the photopolymerizable compound described below and an organic polymer produced by the polymerization thereof. The refractive index of the organic group-containing metal oxide also becomes high.

In the present invention, it is preferred that the number (p) of the phenyl group, and the number (s) of the Si atom which are contained in the organic group-containing metal oxide satisfy the following relationship in the above-mentioned metal oxide composition:

$$s \leq p < 3s.$$

Specifically, it is preferred that one or more and less than three phenyl groups are bonded to one Si atom, as the whole of the metal oxide composition, from the viewpoint of the compatibility with the photopolymerizable compound and an organic polymer produced by the polymerization thereof.

In the present invention, an organic group other than the aromatic groups, for example, an alkyl group may be introduced into Si in the metal oxide. For example, methylphenyldimethoxysilane or the like can be used as long as the advantageous effects of the present invention are not damaged. When a monoalkoxysilane such as trimethylmethoxysilane is present, the polymerization reaction is terminated. Accordingly, the monoalkoxysilane can be used to adjust the molecular weight.

The metal oxide may contain trace amounts of elements other than the above.

In the present invention, the photopolymerizable compound is a photopolymerizable monomer. As the photopolymerizable compound, a compound selected from a radical polymerizable compound and a cation polymerizable compound can be used.

The radical polymerizable compound is not particularly limited as long as the compound has in the molecule one or more radical polymerizable unsaturated double bonds. For example, a monofunctional and multifunctional compound having a (meth) acryloyl group or a vinyl group can be used. The wording "(meth)acryloyl group" is a wording for expressing a methacryloyl group and an acryloyl group collectively.

Examples of the compound having a (meth)acryloyl group, out of the radical polymerizable compounds, include monofunctional (meth)acrylates such as phenoxyethyl (meth)acrylate, 2-methoxyethyl (meth)acrylate, 2-hydroxyethyl (meth) acrylate, benzyl (meth)acrylate, cyclohexyl (meth)acrylate, ethoxydiethylene glycol (meth)acrylate, methoxypolyethylene glycol (meth)acrylate, methyl (meth)acrylate, polyethylene glycol (meth)acrylate, polypropylene glycol (meth)acrylate, and stearyl (meth)acrylate; and polyfunctional (meth)acrylates such as trimethylolpropane tri(meth)acrylate, pentaerythritol tetra(meth)acrylate, dipentaerythritol hexa(meth)acrylate, diethylene glycol di(meth)acrylate, triethylene glycol di(meth)acrylate, tetraethylene glycol di(meth)acrylate, polyethylene glycol di(meth)acrylate, bis(2-hydroxyethyl)isocyanurate di(meth)acrylate, and 2,2-bis[4-(acryloxy-diethoxy)phenyl]propane. However, the compound having a (meth)acryloyl group is not necessarily limited thereto.

Examples of the compound having a vinyl group include monofunctional vinyl compounds such as monovinylbenzene (styrene), and ethylene glycol monovinyl ether; and polyfunctional vinyl compounds such as divinylbenzene, ethylene glycol divinyl ether, diethylene glycol divinyl ether, and triethylene glycol divinyl ether. However, the compound having a vinyl group is not necessarily limited thereto.

One kind of the radical polymerizable compound may be used, and two or more kinds thereof are used together. In the case of making the refractive index of the metal oxide high and making the refractive index of the organic polymer low, in the present invention, a compound having no aromatic group to have low refractive index (for example, refractive index of 1.5 or less) is preferred out of the above-mentioned radical polymerizable compounds. In order to make the compatibility with the metal oxide better, preferred is a more hydrophilic glycol derivative such as polyethylene glycol (meth)acrylate and polyethylene glycol di(meth)acrylate.

The cation polymerizable compound is not particularly limited about the structure as long as the compound has at least one reactive group selected from a cyclic ether group and a vinyl ether group.

Examples of the compound having a cyclic ether group out of such cation polymerizable compounds include compounds having an epoxy group, an alicyclic epoxy group or an oxetanyl group.

Specific examples of the compound having an epoxy group include monofunctional epoxy compounds such as 1,2-epoxyhexadecane, and 2-ethylhexyldiglycol glycidyl ether; and polyfunctional epoxy compounds such as bisphenol A diglycidyl ether, novolak type epoxy resins, triphenylmethane triglycidyl ether, 1,4-butanediol diglycidyl ether, 1,6-hexanediol diglycidyl ether, glycerin triglycidyl ether, trimethylolpropane triglycidyl ether, propylene glycol diglycidyl ether, and polyethylene glycol diglycidyl ether.

Specific examples of the compound having an alicyclic epoxy group include monofunctional compounds such as 1,2-epoxy-4-vinylcyclohexane, D-2,2,6-trimethyl-2,3-epoxybicyclo[3,1,1]heptane, and 3,4-epoxycyclohexylmethyl (meth)acrylate; and polyfunctional compounds such as 2,4-epoxycyclohexylmethyl-3,4-epoxycyclohexane carboxylate, bis(3,4-epoxycyclohexylmethyl) adipate, 2-(3,4-epoxycyclohexyl-5,5-spiro-3,4-epoxy)cyclohexanone-m-dioxane, bis(2,3-epoxycyclopentyl) ether, and EHPE-3150 (alicyclic epoxy resin, manufactured by Dicel Chemical Industries, Ltd.).

Specific examples of the compound having an oxetanyl group include monofunctional oxetanyl compounds such as 3-ethyl-3-hydroxymethyloxetane, 3-ethyl-3-(2-ethylhexyloxymethyl)oxetane, and 3-ethyl-3-(cyclohexyloxymethyl) oxetane; and polyfunctional oxetanyl compounds such as 1,4-bis[(3-ethyl-3-oxetanylmethoxy)methyl]benzene, 1,3-bis[(3-ethyl-3-oxetanylmethoxy)methyl]propane, ethylene glycol bis(3-ethyl-3-oxetanylmethyl) ether, trimethylolpropanetris(3-ethyl-3-oxetanylmethyl) ether, pentaerythritol tetrakis(3-ethyl-3-oxetanylmethyl) ether, dipentaerythritol hexakis(3-ethyl-3-oxetanylmethyl) ether, and ethylene oxide modified bisphenol A bis(3-ethyl-3-oxetanylmethyl) ether.

Specific examples of the compound having a vinyl ether group, out of the above-mentioned cation polymerizable compounds, include monofunctional compounds such as triethylene glycol monovinyl ether, cyclohexanedimethanol monovinyl ether, and 4-hydroxycyclohexyl vinyl ether; and polyfunctional compounds such as triethylene glycol divinyl ether, tetraethylene glycol divinyl ether, trimethylolpropane trivinyl ether, cyclohexane-1,4-dimethylol divinyl ether, 1,4-butanediol divinyl ether, polyester divinyl ether, and polyurethane polyvinyl ether.

One kind of the cation polymerizable compound may be used, or two or more kinds thereof may be used together. As the photopolymerizable compound, an oligomer of the cation polymerizable compounds exemplified above may be used. In the case of making the refractive index of the metal oxide high and making the refractive index of the organic polymer low, in the present invention, a compound having no aromatic group to have low refractive index (for example, refractive index of 1.5 or less) is preferred out of the above-mentioned cation polymerizable compounds. In order to make the compatibility with the metal oxide better, preferred is a more hydrophilic glycol derivative such as polyethylene glycol diglycidyl ether.

It is advisable that in the present invention the photopolymerizable compound is used, for example, in an amount of about 5 to 1,000% by weight of total of the metal oxide, preferably in an amount of 10 to 300% by weight thereof. If the amount is less than 5% by weight, a large refractive index change is not easily obtained at the time of recording. If the amount is more than 1,000% by weight, a large refractive index change is not easily obtained, either, at the time of recording.

In the present invention, it is preferred that the hologram recording material further contains a photopolymerization initiator corresponding to the wavelength of recording light. When the photopolymerization initiator is contained in the hologram recording material, the polymerization of the photopolymerizable compound is promoted by the light exposure at the time of recording. Consequently, a higher sensitivity is achieved.

When a radical polymerizable compound is used as the photopolymerizable compound, a photo radical initiator is used. On the other hand, when a cation polymerizable compound is used as the photopolymerizable compound, a photo cation initiator is used.

Examples of the photo radical initiator include Darocure 1173, Irgacure 784, Irgacure 651, Irgacure 184 and Irgacure 907 (each manufactured by Ciba Specialty Chemicals Inc.). The content of the photo radical initiator is, for example, about 0.1 to 10% by weight, preferably about 0.5 to 5% by weight on the basis of the radical polymerizable compound.

As the photo cation initiator, for example, an onium salt such as a diazonium salt, a sulfonium salt, or a iodonium salt can be used. It is particularly preferred to use an aromatic onium salt. Besides, an iron-arene complex such as a ferrocene derivative, an arylsilanol-aluminum complex, or the like can be preferably used. It is advisable to select an appropriate initiator from these. Specific examples of the photo cation initiator include Cyracure UVI-6970, Cyracure UVI-6974 and Cyracure UVI-6990 (each manufactured by Dow Chemical Co. in USA), Irgacure 264 and Irgacure 250 (each manufactured by Ciba Specialty Chemicals Inc.), and CIT-1682 (manufactured by Nippon Soda Co., Ltd.). The content of the photo cation initiator is, for example, about 0.1 to 10% by weight, preferably about 0.5 to 5% by weight on the basis of the cation polymerizable compound.

The hologram recording material composition may contain a dye that functions as a photosensitizer corresponding to the wavelength of recording light or the like besides the photopolymerization initiator. Examples of the photosensitizer include thioxanthones such as thioxanthen-9-one, and 2,4-diethyl-9H-thioxanthen-9-one; xanthenes; cyanines; melocyanines; thiazines; acridines; anthraquinones; and squaliriums. It is advisable to set a amount to be used of the photosensitizer into the range of about 3 to about 50% by weight of the radical photoinitiator, for example, about 10% by weight thereof.

A process for producing the hologram recording material will be described in the following.

The hologram recording material of the present invention, the production process of which is not particularly limited, is preferably produced by a production process comprising:

mixing an alkoxide compound of Zr as a starting material with a β-dicarbonyl compound to set a mole ratio of the β-dicarbonyl compound to the Zr atom (β-dicarbonyl compound/Zr ratio) to 2/1 or more and 3/1 or less, thereby modifying the alkoxide compound of Zr with the β-dicarbonyl compound;

mixing the alkoxide compound of Zr modified with the β-dicarbonyl compound with an alkoxide compound of Si to set a mole ratio of the Si atom to the Zr atom (Si/Zr ratio) to more than 1/1 and 1.15/1 or less;

hydrolyzing the mixed alkoxide compounds to yield a precursor of a metal oxide;

incorporating a photopolymerizable compound into the resultant system before, during or after the hydrolysis; and advancing a polycondensation reaction of the metal oxide precursor into which the photopolymerizable compound is incorporated.

First, an alkoxide compound of Zr as a starting material is mixed with a β-dicarbonyl compound to set a mole ratio of the β-dicarbonyl compound to the Zr atom (β-dicarbonyl compound/Zr ratio) to 2/1 or more and 3/1 or less, in order to modify the alkoxide compound of Zr with the β-dicarbonyl compound as a complexing ligand. A Zr alkoxide compound represented by the above-mentioned formula (I) is preferably used as the alkoxide compound of Zr as the starting material. The solvent used at this time may be the same solvent as used in the sol-gel reaction.

Next, an alkoxide compound of Si is mixed with the modified alkoxide compound of Zr, the reactivity of which is restrained by the modification with the β-dicarbonyl compound, to set a mole ratio of the Si atom to the Zr atom (Si/Zr ratio) to more than 1/1 and 1.15/1 or less, for example, 1.01/1 or more and 1.15/1 or less. A diarylalkoxide compound of Si is preferably used as the alkoxide compound of Si.

Next, the mixed alkoxide compounds are hydrolyzed and polycondensed to yield a precursor of a metal oxide. The hydrolysis and polycondensation reaction can be carried out by the same operation under the same conditions as in known sol-gel methods. For example, the metal alkoxide compounds (the diphneylalkoxide compound of Si, and the modified compound of Zr) in a predetermined ratio are dissolved into an appropriate good solvent to prepare a homogeneous solution. An appropriate acid catalyst is dropwise added to the solution, and the solution is stirred in the presence of water, whereby the reaction can be conducted.

Examples of such a solvent include: water; alcohols such as methanol, ethanol, propanol, isopropanol, and butanol; ethers such as diethyl ether, dioxane, dimethoxyethane and tetrahydrofuran; and N-methylpyrrolidone, acetonitrile, N,N-dimethylformamide, N,N-dimethylacetamide, dimethylsulfoxide, acetone, benzene, and the like. The solvent may be appropriately selected from these. Alternatively, a mixture of these may be used. The amount of the solvent is not limited, and is preferably 10 to 1,000 parts by weight with respect to 100 parts by weight of the whole of the metal alkoxide compound.

Examples of the acid catalyst include: inorganic acids such as hydrochloric acid, sulfuric acid, nitric acid and phosphoric acid; organic acids such as formic acid, acetic acid, trichloroacetic acid, trifluoroacetic acid, propionic acid, methanesulfonic acid, ethanesulfonic acid, and p-toluenesulfonic acid; and the like.

The hydrolysis polymerization reaction can be generally conducted at room temperature, which depends on the reactivity of the metal alkoxide compounds. The reaction can be conducted at a temperature of about 0 to 150° C., preferably at a temperature of about room temperature to 50° C. The reaction time may be appropriately determined, correspondingly to the relationship with the reaction temperature. The time is about 0.1 to 240 hours. The reaction may be conducted in an inert atmosphere such as nitrogen gas, or may be conducted under a reduced pressure of about 0.5 to 1 atom while the alcohol produced by the polymerization reaction is removed.

Before, during or after the hydrolysis, the photopolymerizable organic compound is mixed. The photopolymerizable organic compound may be mixed with the metal alkoxide compounds as the sol-gel starting materials after, during or before the hydrolysis. In the case of the mixing after the hydrolysis, it is preferred to add and mix the photopolymerizable organic compound in the state that the sol-gel reaction system containing the metal oxide and/or the metal oxide precursor is sol in order to perform the mixing uniformly. In the case of the mixing before the hydrolysis, the mixing of the photopolymerizable organic compound is preferably conducted after the modification step of the Zr alkoxide compound, and after the mixing step of the modified Zr alkoxide compound and the Si alkoxide compound. The mixing of a photopolymerization initiator or photosensitizer can also be conducted before, during or after the hydrolysis.

A polycondensation reaction of the metal oxide precursor with which the photopolymerizable compound is mixed is advanced to yield a hologram recording material liquid wherein the photopolymerizable compound is uniformly incorporated in a sol-form metal oxide matrix. This hologram recording material liquid contains the metal oxides that have various molecular weights.

In this process, the reactivity of the Zr alkoxide compound is controlled or restrained by modifying said compound with the specified amount of β-dicarbonyl compound, and further the Zr alkoxide compound and the Si alkoxide compound are used in the specified ratio. Therefore, the metal oxide matrix is obtained in a very even gel- or sol-form.

The hologram recording material liquid in which the photopolymerizable compound and the sol-form organic group-containing metal oxide are uniformly mixed with each other is applied onto a substrate, and then the solvent is dried. As the case may be, the sol-gel reaction is further advanced. As a result, a hologram recording material layer in a film form is yielded. In such a way, the hologram recording material layer is produced wherein the photopolymerizable compound is uniformly incorporated in the metal oxide matrix.

The hologram recording medium of the present invention comprises at least the above-mentioned hologram recording material layer. Usually, a hologram recording medium comprises a supporting substrate (i.e., a substrate) and a hologram recording material layer; however, a hologram recording medium may be made only of a hologram recording material layer without having any supporting substrate. For example, a medium composed only of a hologram recording material layer may be obtained by forming the hologram recording material layer onto the substrate by application, and then peeling the hologram recording material layer off from the substrate. In this case, the hologram recording material layer is, for example, a layer having a thickness in the order of millimeters.

The hologram recording medium of the present invention is suitable for record and reproduction using not only a green laser light but also a blue laser light having a wavelength of 350 to 450 nm. When the reproduction is made using transmitted light, the medium preferably has a light transmittance of 50% or more at a wavelength of 405 nm. When the reproduction is made using reflected light, the medium preferably has a light reflectance of 25% or more at a wavelength of 405 nm.

The hologram recording medium is either of a medium having a structure for performing reproduction using transmitted light (hereinafter referred to as a transmitted light reproducing type medium), and a medium having a structure for performing reproduction using reflected light (hereinafter referred to as a reflected light reproducing type medium) in accordance with an optical system used for the medium.

The transmitted light reproducing type medium is constructed in such a manner that a laser light for readout is irradiated into the medium, the laser light irradiated therein is diffracted by signals recorded in its hologram recording material layer, and the laser light transmitted through the medium is converted to electric signals by means of an image sensor. In other words, in the transmitted light reproducing type medium, the laser light to be detected is transmitted through the medium toward the medium side opposite to the medium side into which the reproducing laser light is irradiated. The transmitted light reproducing type medium usually has a structure wherein its recording material layer is sandwiched between two supporting substrates. In an optical system used for the medium, the image sensor, for detecting the transmitted laser light, is set up in the medium side opposite to the medium side into which the reproducing laser light emitted from a light source is irradiated.

Accordingly, in the transmitted light reproducing type medium, the supporting substrate, the recording material layer, and any other optional layer(s) are each made of a light-transmitting material. It is unallowable that any element blocking the transmission of the reproducing laser light is substantially present. The supporting substrate is usually a rigid substrate made of glass or resin.

In the meantime, the reflected light reproducing type medium is constructed in such a manner that a laser light for readout is irradiated into the medium, the laser light irradiated therein is diffracted by signals recorded in its hologram recording material layer, and then, the laser light is reflected on its reflective film, and the reflected laser light is converted to electric signals by means of an image sensor. In other words, in the reflected light reproducing type medium, the laser light to be detected is reflected toward the same medium side as the medium side into which the reproducing laser light is irradiated. The reflected light reproducing type medium usually has a structure wherein the recording material layer is formed on a supporting substrate positioned at the medium side into which the reproducing laser light is irradiated; and a reflective film and an another supporting substrate are formed on the recording material layer. In an optical system used for the medium, the image sensor, for detecting the reflected laser light, is set up in the same medium side as the medium side into which the reproducing laser light emitted from a light source is irradiated.

Accordingly, in the reflected light reproducing type medium, the supporting substrate positioned at the medium surface side into which the reproducing laser light is irradiated, the recording material layer, and other optional layer(s) positioned nearer to the medium side into which the reproducing laser light is irradiated than the reflective film are each made of a light-transmitting material. It is unallowable that these members each substantially contain an element blocking the incident or reflective reproducing laser light. The supporting substrate is usually a rigid substrate made of glass or resin. The supporting substrate positioned at the medium surface side into which the reproducing laser light is irradiated is required to have a light-transmitting property.

In any case of the transmitted light reproducing type medium and the reflected light reproducing type medium, it is important that the hologram recording material layer has a high light transmittance of, for example, 50% or more at a wavelength of 405 nm. For example, in the case of considering a layer (100 μm in thickness) composed only of the matrix material (organic group-containing metal oxide material), it is preferred that the layer has a high light transmittance of 90% or more at a wavelength of 405 nm.

The hologram recording material layer obtained as above-mentioned has a high transmittance to a blue laser. Therefore, even if a thickness of the recording material layer is set to 100 μm, a recording medium having a light transmittance of 50% or more, preferably 55% or more at a wavelength of 405 nm is obtained when the medium is a transmitted light reproducing type medium; or a recording medium having a light reflectance of 25% or more, preferably 27.5% or more at a wavelength of 405 nm is obtained when the medium is a reflected light reproducing type medium. In order to attain holographic memory recording characteristics such that a high multiplicity is ensured, necessary is a recording material layer having a thickness of 100 μm or more, preferably 200 μm or more. According to the present invention, however, even if the thickness of the recording material layer is set to, for example, 1 mm, it is possible to ensure a light transmittance of 50% or more at a wavelength of 405 nm (when the medium is a transmitted light reproducing type medium), or a light reflectance of 25% or more at a wavelength of 405 nm (when the medium is a reflected light reproducing type medium).

When the above described hologram recording material layer is used, a hologram recording medium having a recording layer thickness of 100 μm or more, which is suitable for data storage, can be obtained. The hologram recording medium can be produced by forming the hologram recording material in a film form onto a substrate, or sandwiching the hologram recording material in a film form between substrates.

In a transmitted light reproducing type medium, it is preferred to use, for the substrate(s), a material transparent to a recording/reproducing wavelength, such as glass or resin. It is preferred to form an anti-reflection film against the recording/reproducing wavelength for preventing noises or give address signals and so on, onto the substrate surface at the side opposite to the layer of the hologram recording material. In order to prevent interface reflection, which results in noises, it is preferred that the refractive index of the hologram recording material and that of the substrate are substantially equal to each other. It is allowable to form, between the hologram recording material layer and the substrate, a refractive index adjusting layer comprising a resin material or oil material having a refractive index substantially equal to that of the recording material or the substrate. In order to keep the thickness of the hologram recording material layer between the substrates, a spacer suitable for the thickness between the substrates may be arranged. End faces of the recording material medium are preferably subjected to treatment for sealing the recording material.

About the reflected light reproducing type medium, it is preferred that the substrate positioned at the medium surface side into which a reproducing laser light is irradiated is made of a material transparent to a recording and reproducing wavelength, such as glass or resin. As the substrate positioned at the medium surface side opposite to the medium surface side into which a reproducing laser light is irradiated, a substrate having thereon a reflective film is used. Specifically, a reflective film made of, for example, Al, Ag, Au or an alloy made mainly of these metals and the like is formed on a surface of a rigid substrate (which is not required to have a light-transmitting property), such as glass or resin, by vapor deposition, sputtering, ion plating, or any other film-forming method, whereby a substrate having thereon the reflective film is obtained. A hologram recording material layer is provided so as to have a predetermined thickness on the surface of the reflective film of this substrate, and further a light-transmitting substrate is caused to adhere onto the surface of this recording material layer. An adhesive layer, a flattening layer and the like may be provided between the hologram recording material layer and the reflective film, and/or between the hologram recording material layer and the light-transmitting substrate. It is also unallowable that these optional layers hinder the transmission of the laser light. Others than this matter are the same as in the above-mentioned transmitted light reproducing type medium.

According to the hologram recording medium of the present invention, the recording material layer is uniform; thus, a problem of light scattering is not caused. Further, at the time of recording, the photopolymerizable organic compound is turned into a polymer in the exposed portion; the preferred organic group-containing metal oxide has the organometallic unit, wherein two aromatic groups are bonded directly to one Si atom, so that the organic group-containing metal oxide is very good compatible with the polymer. Therefore, according to the hologram recording medium of the present invention, the compatibility is sufficiently kept and problems of light scattering and a fall in the transmittance are not caused when or after recording is performed.

Accordingly, the hologram recording medium having the hologram recording material of the present invention can be preferably used not only in a system wherein record and reproduction are made using a green laser light but also in a system wherein record and reproduction are made using a blue laser light having a wavelength of 350 to 450 nm.

EXAMPLES

The present invention will be specifically described by way of the following examples; however, the invention is not limited to the examples.

Example 1

(Synthesis of a Matrix Material)

In 1.0 mL of a n-butanol solvent, 3.21 g of tetra-n-butoxyzirconium ($Zr(O-nBu)_4$, manufactured by Azmax Co., Ltd.) and 2.10 g of ethyl acetoacetate (EtAcAc) were mixed with each other at a room temperature, and then the mixture was stirred for 10 minutes. The ratio by mole of $EtAcAc/Zr(O-nBu)_4$ was 2.25/1. To this reaction mixture was added 1.95 g of diphenyldimethoxysilane (manufactured by Shin-Etsu Chemical Co., Ltd.) to prepare a metal alkoxide solution. The ratio by mole of Si/Zr was 1.1/1.

An acid catalyst solution composed of 0.113 mL of water, 0.045 mL of a 2 N aqueous solution of hydrochloric acid, and 0.75 mL of an ethanol was dropwise added to the above-mentioned metal alkoxide solution at a room temperature while the alkoxide solution was stirred. The stirring was continued for 30 minutes to conduct hydrolysis and condensation reaction. In this way, a sol solution was obtained.

(Photopolymerizable Compound)

To 100 parts by weight of polyethylene glycol diacrylate (M-245, manufactured by Toagosei Co., Ltd.) as a photopolymerizable compound were added 3 parts by weight of a photopolymerization initiator (IRG-907, manufactured by Ciba Specialty Chemicals K.K.) and 0.15 part by weight of 2,4-diethyl-9H-thioxanthen-9-one as a photosensitizer to prepare a mixture containing the photopolymerizable compound.

(Hologram Recording Material)

The sol solution and the mixture containing the photopolymerizable compound were mixed with each other at a room temperature to set the ratio of the matrix material (as a non-volatile component) and that of the photopolymerizable compound to 67 parts by weight and 33 parts by weight, respectively. Furthermore, the sol-gel reaction was sufficiently advanced for 1 hour in a state that light was shielded from the system, so as to yield a hologram recording material solution.

The resultant hologram recording material solution was applied onto a glass substrate and then dried to prepare a recording medium sample, as will be detailed below.

With reference to FIG. 1, which schematically illustrates a cross section of a hologram recording medium, explanation will be described.

A glass substrate (22) having a thickness of 1 mm and having one surface on which an anti-reflection film (22a) was formed was prepared. A spacer (24) having a predetermined thickness was put on a surface of the glass substrate (22) on which the anti-reflection film (22a) was not formed, and the hologram recording material solution obtained was applied onto the surface of the glass substrate (22). The resultant was dried at a room temperature for 1 hour, and then dried at 40°

C. for 24 hours to volatilize the solvent. Through this drying step, the gelation (condensation reaction) of the organic group-containing metal oxide was advanced so as to yield a hologram recording material layer (21) having a dry film thickness of 340 μm wherein the organic group-containing metal oxide and the photopolymerizable compound were uniformly dispersed.

(Hologram Recording Medium)

The hologram recording material layer (21) formed on the glass substrate (22) was covered with another glass substrate (23) having a thickness of 1 mm and having one surface on which an anti-reflection film (23a) was formed. At this time, the covering was carried out in such a manner that a surface of the glass substrate (23) on which the anti-reflection film (23a) was not formed would contact the surface of the hologram recording material layer (21). In this way, a hologram recording medium (11) was obtained which had a structure wherein the hologram recording material layer (21) was sandwiched between the two glass substrates (22) and (23).

(Evaluation of Characteristics)

Figure 2:
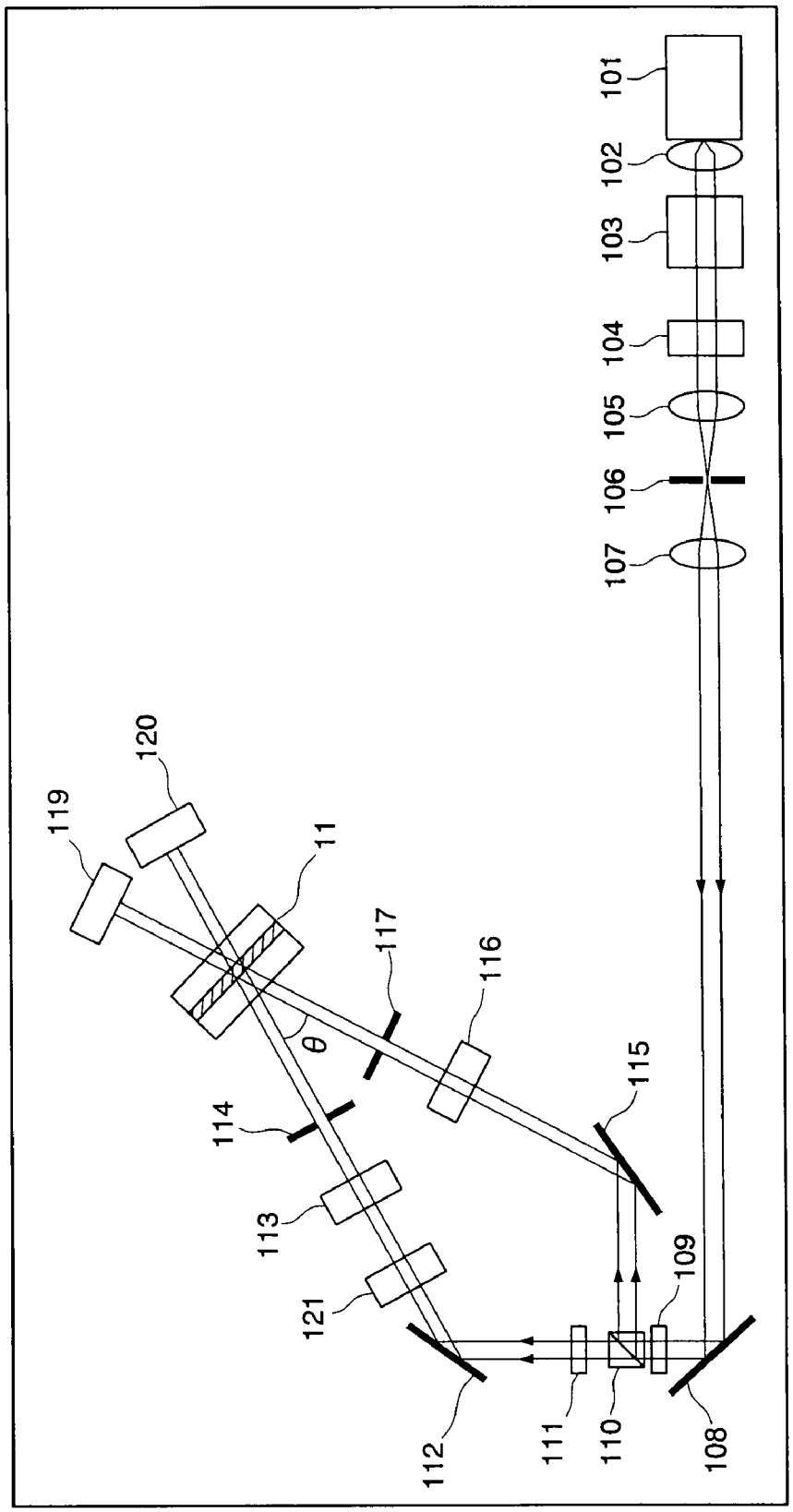
FIG. 2 is a plane view illustrating the outline of a hologram recording optical system used in the example.

About the resultant hologram recording material sample, characteristics thereof were evaluated in a hologram recording optical system as illustrated in FIG. 2. The direction along which the paper surface on which FIG. 2 is drawn stretches is defined as a horizontal direction for convenience' sake.

In FIG. 2, the hologram recording medium sample (11) was set to make the recording material layer perpendicular to the horizontal direction.

In the hologram recording optical system illustrated in FIG. 2, a light source (101) for emitting a semiconductor laser (wavelength: 405 nm) in a single mode oscillation was used. Light emitted from this light source (101) was subjected to a spatial filtrating treatment by means of a beam rectifier (102), a light isolator (103), a shutter (104), a convex lens (105), a pin hole (106), and a convex lens (107), so as to be collimated, thereby enlarging the light into a beam diameter of about 10 mmφ. The enlarged beam was passed through a mirror (108) and a 1/2 wavelength plate (109) to take out 45° (45 degree) polarized light. The light was split into an S wave and a P wave (the ratio of S wave/P wave is 1/1) through a polarized beam splitter (110). The S wave obtained by the splitting was passed through a mirror (115), a polarizing filter (116), and an iris diaphragm (117) while a 1/2 wavelength plate (111) was used to convert the P wave obtained by the splitting to an S wave and then the S wave was passed through a mirror (112), a polarizing filter (113) and an iris diaphragm (114). In this way, the total incident angle θ of the two light fluxes irradiated into the hologram recording medium sample (11) was set to 37°, so as to record interference fringes of the two light fluxes in the sample (11).

The sample (11) was rotated in the horizontal direction to attain multiplexing (angle multiplexing; sample angle: −21° to +21°, angular interval: 3°) and further the sample (11) was rotated around an axis perpendicular to the surface of the sample 11 to attain multiplexing (peristrophic multiplexing; sample angle: 0 to 90°, angular interval: 10°), thereby recording a hologram. The multiplicity was 150. At the time of the recording, the sample was exposed to the light while the iris diaphragms (114) and (117) were each set into 4φ.

Details of this multiple recording will be described hereinafter. The sample (11) was rotated in the horizontal direction (around the axis perpendicular to the paper surface) from −21° to +21° at angular intervals of 3° to attain multiplexing. Thereafter, the sample (11) was rotated at 10° (i.e., 10° when it was viewed from the side into which the laser light was irradiated) around the axis perpendicular to the surface of the sample (11). The sample (11) was again rotated in the horizontal direction from −21° to +21° at angular intervals of 3° to attain multiplexing. This was repeated 10 times to rotate the sample (11) around the axis perpendicular to the surface of the sample (11) from 0° to 90°, thereby attaining multiple recording giving a multiplicity of 150.

A position where the angle of the surface of the sample (11) to a central line (not illustrated) for dividing the angle θ made by the two light fluxes into two equal parts was 90° was defined as a position where the angle in the horizontal rotation was ±0°. The axis perpendicular to the surface of the sample (11) is as follows: when the sample (11) is rectangular, the axis is a perpendicular axis passing at an intersection point of the two diagonal lines; and when the sample (11) is circular, the axis is a perpendicular axis passing at the center of the circle.

In order to react remaining unreacted components after the hologram recording, a sufficient quantity of light was irradiated by use of only one light fluxes. At the time of reproduction, with shading by the shutter (121), the iris diaphragm (117) was set into 3φ and only one light flux was irradiated. The sample (11) was continuously rotated into the horizontal direction from −23° to +23° and further rotated around the axis perpendicular to the surface of the sample (11) from 0° to 90° at angular intervals of 10°. In the individual angle positions, the diffraction efficiency was measured with a power meter (120). When a change in the volume (a recording shrinkage) or a change in the average refractive index of the recording material layer is not generated before and after the recording, the diffraction peak angle in the horizontal direction at the time of the recording is consistent with that at the time of the reproduction. Actually, however, a recording shrinkage or a change in the average refractive index is generated; therefore, the diffraction peak angle in the horizontal direction at the time of the reproduction is slightly different from the diffraction peak angle in the horizontal direction at the time of the recording. For this reason, at the time of the reproduction, the angle in the horizontal direction was continuously changed and then the diffraction efficiency was calculated from the peak intensity when a diffraction peak made its appearance. In FIG. 2, reference number (119) represents a power meter not used in this example.

At this time, a dynamic range M/# (the sum of the square roots of the diffraction efficiencies) was a high value of 24.0, which was a converted value corresponding to the case that the thickness of the hologram recording material layer was converted to 1 mm. A light transmittance of the medium (recording layer thickness: 340 μm) before the recording exposure to light (i.e., at the initial stage) was 68.8% at 405 nm. A fall in the light transmittance of the medium at 405 nm (i.e., the recording wavelength) after the recording was not observed.

At this time, a reduction ratio in the light transmittance on the basis of the glass substrates (22) and (23) each having the anti-reflection film was 0.6%. Specifically, with reference to FIG. 1, a laser light was irradiated into the sample (11) from the side of the substrate (22), so as to be transmitted toward the side of the substrate (23); in this case, 0.3% of the light was reflected on the interface between the air and the anti-reflection film (22a) by the presence of the anti-reflection film (22a), and 99.7% thereof was transmitted (absorption: 0%), and 0.3% of the transmitted light (that is, 99.7%) was reflected on the interface between the anti-reflection film (23a) of the substrate (23) and the air. As a result, 99.4% of the original laser light was transmitted.

The refractive index of the glass substrates (22) and (23) was substantially equal to that of the hologram recording material layer (21); therefore, reflection on the interface between the glass substrate (22) and the recording material layer (21) and reflection on the interface between the recording material layer (21) and the glass substrate (23) may be neglected.

Example 2

(Synthesis of a Matrix Material)

In 1.0 mL of a n-butanol solvent, 4.28 g of tetra-n-butoxyzirconium ($Zr(O-nBu)_4$, manufactured by Azmax Co., Ltd.) and 3.07 g of ethyl acetoacetate (EtAcAc) were mixed with each other at a room temperature, and then the mixture was stirred for 10 minutes. The ratio by mole of EtAcAc/$Zr(O-nBu)_4$ was 2.50/1. To this reaction mixture was added 2.60 g of diphenyldimethoxysilane (manufactured by Shin-Etsu Chemical Co., Ltd.) to prepare a metal alkoxide solution. The ratio by mole of Si/Zr was 1.1/1.

An acid catalyst solution composed of 0.15 mL of water, 0.06 mL of a 2 N aqueous solution of hydrochloric acid, and 1.0 mL of an ethanol was dropwise added to the above-mentioned metal alkoxide solution at a room temperature while the alkoxide solution was stirred. The stirring was continued for 30 minutes to conduct hydrolysis and condensation reaction. In this way, a sol solution was obtained.

A hologram recording material solution was prepared in the same manner as in Example 1 except that the resultant sol solution was used. The resultant hologram recording material solution was applied in the same manner as in Example 1 to yield a hologram recording material layer (21) having a dry thickness of 290 μm. A hologram recording medium (11) was obtained in this manner.

About the resultant hologram recording medium sample, characteristics thereof were evaluated in the same manner as in Example 1. As a result, a dynamic range M/# was a high value of 20.6, which was a converted value corresponding to the case that the thickness of the hologram recording material layer was converted to 1 mm.

A light transmittance of the medium (recording layer thickness: 290 μm) before the recording exposure to light (i.e., at the initial stage) was 78.6% at 405 nm. A fall in the light transmittance of the medium at 405 nm (i.e., the recording wavelength) after the recording was not observed.

Example 3

(Synthesis of a Matrix Material)

In 1.0 mL of a n-butanol solvent, 4.28 g of tetra-n-butoxyzirconium ($Zr(O-nBu)_4$, manufactured by Azmax Co., Ltd.) and 3.49 g of ethyl acetoacetate (EtAcAc) were mixed with each other at a room temperature, and then the mixture was stirred for 10 minutes. The ratio by mole of EtAcAc/$Zr(O-nBu)_4$ was 2.80/1. To this reaction mixture was added 2.60 g of diphenyldimethoxysilane (manufactured by Shin-Etsu Chemical Co., Ltd.) to prepare a metal alkoxide solution. The ratio by mole of Si/Zr was 1.1/1.

An acid catalyst solution composed of 0.15 mL of water, 0.06 mL of a 2 N aqueous solution of hydrochloric acid, and 1.0 mL of an ethanol was dropwise added to the above-mentioned metal alkoxide solution at a room temperature while the alkoxide solution was stirred. The stirring was continued for 30 minutes to conduct hydrolysis and condensation reaction. In this way, a sol solution was obtained.

A hologram recording material solution was prepared in the same manner as in Example 1 except that the resultant sol solution was used. The resultant hologram recording material solution was applied in the same manner as in Example 1 to yield a hologram recording material layer (21) having a dry thickness of 330 μm. A hologram recording medium (11) was obtained in this manner.

About the resultant hologram recording medium sample, characteristics thereof were evaluated in the same manner as in Example 1. As a result, a dynamic range M/# was a high value of 17.6, which was a converted value corresponding to the case that the thickness of the hologram recording material layer was converted to 1 mm.

A light transmittance of the medium (recording layer thickness: 330 μm) before the recording exposure to light (i.e., at the initial stage) was 76.0% at 405 nm. A fall in the light transmittance of the medium at 405 nm (i.e., the recording wavelength) after the recording was not observed.

Comparative Example 1

(Synthesis of a Matrix Material)

In 0.5 mL of a n-butanol solvent, 2.56 g of tetra-n-butoxyzirconium ($Zr(O-nBu)_4$, manufactured by Azmax Co., Ltd.) and 1.43 g of ethyl acetoacetate (EtAcAc) were mixed with each other at a room temperature, and then the mixture was stirred for 10 minutes. The ratio by mole of EtAcAc/$Zr(O-nBu)_4$ was 1.95/1. To this reaction mixture was added 1.40 g of diphenyldimethoxysilane (manufactured by Shin-Etsu Chemical Co., Ltd.) to prepare a metal alkoxide solution. The ratio by mole of Si/Zr was 1/1.

An acid catalyst solution composed of 0.075 mL of water, 0.03 mL of a 2 N aqueous solution of hydrochloric acid, and 0.5 mL of an ethanol was dropwise added to the above-mentioned metal alkoxide solution at a room temperature while the alkoxide solution was stirred. The stirring was continued for 30 minutes to conduct hydrolysis and condensation reaction. In this way, a sol solution was obtained.

A hologram recording material solution was prepared in the same manner as in Example 1 except that the resultant sol solution was used. The resultant hologram recording material solution was applied in the same manner as in Example 1 to yield a hologram recording material layer (21) having a dry thickness of 330 μm. A hologram recording medium (11) was obtained in this manner.

About the resultant hologram recording medium sample, characteristics thereof were evaluated in the same manner as in Example 1. As a result, a dynamic range M/# was 6.4, which was a converted value corresponding to the case that the thickness of the hologram recording material layer was converted to 1 mm.

A light transmittance of the medium (recording layer thickness: 330 μm) before the recording exposure to light (i.e., at the initial stage) was 60.0% at 405 nm. A fall in the light transmittance of the medium at 405 nm (i.e., the recording wavelength) after the recording was not observed.

Comparative Example 2

(Synthesis of a Matrix Material)

In 1.0 mL of a n-butanol solvent, 4.28 g of tetra-n-butoxyzirconium ($Zr(O-nBu)_4$, manufactured by Azmax Co., Ltd.) and 4.19 g of ethyl acetoacetate (EtAcAc) were mixed with each other at a room temperature, and then the mixture was stirred for 10 minutes. The ratio by mole of EtAcAc/$Zr(O-nBu)_4$ was 3.30/1. To this reaction mixture was added 2.60 g of diphenyldimethoxysilane (manufactured by Shin-Etsu Chemical Co., Ltd.) to prepare a metal alkoxide solution. The ratio by mole of Si/Zr was 1.1/1.

An acid catalyst solution composed of 0.15 mL of water, 0.06 mL of a 2 N aqueous solution of hydrochloric acid, and 1.0 mL of an ethanol was dropwise added to the above-mentioned metal alkoxide solution at a room temperature while the alkoxide solution was stirred. The stirring was continued for 30 minutes to conduct hydrolysis and condensation reaction. In this way, a sol solution was obtained.

A hologram recording material solution was prepared in the same manner as in Example 1 except that the resultant sol solution was used. The resultant hologram recording material solution was applied in the same manner as in Example 1 to yield a hologram recording material layer (21) having a dry thickness of 300 μm. A hologram recording medium (11) was obtained in this manner.

About the resultant hologram recording medium sample, characteristics thereof were evaluated in the same manner as in Example 1. As a result, a dynamic range M/# was 14.0, which was a converted value corresponding to the case that the thickness of the hologram recording material layer was converted to 1 mm.

A light transmittance of the medium (recording layer thickness: 300 μm) before the recording exposure to light (i.e., at the initial stage) was 78.2% at 405 nm. A fall in the light transmittance of the medium at 405 nm (i.e., the recording wavelength) after the recording was not observed.

Comparative Example 3

(Synthesis of a Matrix Material)

In 1.0 mL of a n-butanol solvent, 5.10 g of tetra-n-butoxyzirconium ($Zr(O-nBu)_4$, manufactured by Azmax Co., Ltd.) and 3.46 g of ethyl acetoacetate (EtAcAc) were mixed with each other at a room temperature, and then the mixture was stirred for 10 minutes. The ratio by mole of $EtAcAc/Zr(O-nBu)_4$ was 2.30/1. To this reaction mixture was added 2.60 g of diphenyldimethoxysilane (manufactured by Shin-Etsu Chemical Co., Ltd.) to prepare a metal alkoxide solution. The ratio by mole of Si/Zr was 0.93/1.

An acid catalyst solution composed of 0.15 mL of water, 0.06 mL of a 2 N aqueous solution of hydrochloric acid, and 1.0 mL of an ethanol was dropwise added to the above-mentioned metal alkoxide solution at a room temperature while the alkoxide solution was stirred. The stirring was continued for 30 minutes to conduct hydrolysis and condensation reaction. In this way, a sol solution was obtained.

A hologram recording material solution was prepared in the same manner as in Example 1 except that the resultant sol solution was used. The resultant hologram recording material solution was applied in the same manner as in Example 1 to yield a hologram recording material layer (21) having a dry thickness of 360 μm. A hologram recording medium (11) was obtained in this manner.

About the resultant hologram recording medium sample, characteristics thereof were evaluated in the same manner as in Example 1. As a result, a dynamic range M/# was 6.6, which was a converted value corresponding to the case that the thickness of the hologram recording material layer was converted to 1 mm.

A light transmittance of the medium (recording layer thickness: 360 μm) before the recording exposure to light (i.e., at the initial stage) was 72.5% at 405 nm. A fall in the light transmittance of the medium at 405 nm (i.e., the recording wavelength) after the recording was not observed.

Comparative Example 4

(Synthesis of a Matrix Material)

In 2.0 mL of a n-butanol solvent, 8.2 g of tetra-tert-butoxyzirconium ($Zr(O-tBu)_4$, manufactured by Kojundo Chemical Lab. Co., Ltd.) and 5.56 g of ethyl acetoacetate (EtAcAc) were mixed with each other at a room temperature, and then the mixture was stirred for 10 minutes. The ratio by mole of $EtAcAc/Zr(O-tBu)_4$ was 2.00/1. To this reaction mixture was added 5.2 g of diphenyldimethoxysilane (manufactured by Shin-Etsu Chemical Co., Ltd.) to prepare a metal alkoxide solution. The ratio by mole of Si/Zr was 1/1.

An acid catalyst solution composed of 0.6 mL of water, 0.24 mL of a 2 N aqueous solution of hydrochloric acid, and 2 mL of tetrahydrofuran was dropwise added to the metal alkoxide solution at a room temperature with stirring. The stirring was continued for 1 hour to conduct hydrolysis and condensation reaction. In this way, a sol solution was obtained.

(Photopolymerizable Compound)

To 100 parts by weight of polyethylene glycol diacrylate (M-245, manufactured by Toagosei Co., Ltd.) as a photopolymerizable compound were added 3 parts by weight of a photopolymerization initiator (IRG-907, manufactured by Ciba Specialty Chemicals K.K.) and 0.3 part by weight of 2,4-diethyl-9H-thioxanthen-9-one as a photosensitizer to prepare a mixture containing the photopolymerizable compound.

(Hologram Recording Material)

The sol solution and the mixture containing the photopolymerizable compound were mixed with each other at a room temperature to set the ratio of the matrix material (as a non-volatile component) and that of the photopolymerizable compound to 67 parts by weight and 33 parts by weight, respectively. Furthermore, the sol-gel reaction was sufficiently advanced for 1 hour in a state that light was shielded from the system, so as to yield a hologram recording material solution.

The resultant hologram recording material solution was applied in the same manner as in Example 1 to yield a hologram recording material layer (21) having a dry thickness of 380 μm. A hologram recording medium (11) was obtained in this manner.

About the resultant hologram recording medium sample, characteristics thereof were evaluated in the same manner as in Example 1. As a result, a dynamic range M/# was 8.1, which was a converted value corresponding to the case that the thickness of the hologram recording material layer was converted to 1 mm.

A light transmittance of the medium (recording layer thickness: 380 μm) before the recording exposure to light (i.e., at the initial stage) was 61.0% at 405 nm. A fall in the light transmittance of the medium at 405 nm (i.e., the recording wavelength) after the recording was not observed.

Comparative Example 5

In this Comparative Example, a Ti alkoxide compound (i.e., a decamer of titanium butoxide represented by the following structural formula) was used, without using Zr alkoxide compound.

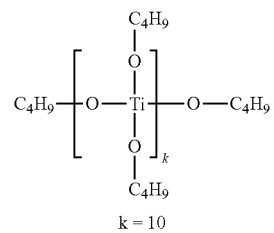

$k = 10$ (Synthesis of a Matrix Material)

In 6 mL of a tetrahydrofuran solvent, 7.8 g of diphenyldimethoxysilane (manufactured by Shin-Etsu Chemical Co., Ltd.) and 7.2 g of the titanium butoxide decamer (B-10, manufactured by Nippon Soda Co., Ltd.) were mixed with each other to prepare an alkoxide solution. The ratio by mole of Si/Ti was 1/1.

An acid catalyst solution composed of 0.9 mL of water, 0.36 mL of a 2 N aqueous solution of hydrochloric acid, and 3 mL of tetrahydrofuran was dropwise added to the alkoxide solution at a room temperature with stirring. The stirring was continued for 1 hour to conduct hydrolysis and condensation reaction. In this way, a sol solution was obtained.
(Photopolymerizable Compound)

To 100 parts by weight of polyethylene glycol diacrylate (M-245, manufactured by Toagosei Co., Ltd.) as a photopolymerizable compound were added 3 parts by weight of a photopolymerization initiator (IRG-907, manufactured by Ciba Specialty Chemicals K.K.) and 0.3 part by weight of thioxanthen-9-one as a photosensitizer to prepare a mixture containing the photopolymerizable compound.
(Hologram Recording Material)

The sol solution and the mixture containing the photopolymerizable compound were mixed with each other at a room temperature to set the ratio of the matrix material (as a non-volatile component) and that of the photopolymerizable compound to 67 parts by weight and 33 parts by weight, respectively. Furthermore, the sol-gel reaction was sufficiently advanced for 1 hour in a state that light was shielded from the system, so as to yield a hologram recording material solution.

The resultant hologram recording material solution was applied in the same manner as in Example 1 to yield a hologram recording material layer (21) having a dry thickness of 390 μm. A hologram recording medium (11) was obtained in this manner.

About the resultant hologram recording medium sample, characteristics thereof were evaluated in the same manner as in Example 1. As a result, a dynamic range M/# was 11.4, which was a converted value corresponding to the case that the thickness of the hologram recording material layer was converted to 1 mm. However, a light transmittance of the medium (recording layer thickness: 390 μm) before the recording exposure to light (i.e., at the initial stage) was 31.0% at 405 nm. After the recording, the light transmittance of the medium at 405 nm (i.e., the recording wavelength) was a lowered value of 1%.

The results are shown in Table 1. Each of the hologram recording medium samples produced in Examples 1, 2 and 3 showed the significantly high value of the dynamic range M/#.

What is claimed is:

1. A hologram recording material comprising:
    a metal oxide containing at least Si and Zr as metals wherein a β-dicarbonyl compound is coordinated to Zr; and
    a photopolymerizable compound,
    wherein a mole ratio of the β-dicarbonyl compound to the Zr atom (β-dicarbonyl compound/Zr ratio) is 2.2/1 or more and 2.8/1 or less, and a mole ratio of the Si atom to the Zr atom (Si/Zr ratio) is more than 1/1 and 1.15/1 or less in the metal oxide.

2. The hologram recording material according to claim 1, wherein the metal oxide has an organometallic unit in which two aromatic groups are directly bonded to Si.

3. A hologram recording medium having a hologram recording layer comprising the hologram recording material according to claim 2.

4. The hologram recording medium according to claim 3, wherein record/reproduction of said hologram recording medium are performed using a laser light having a wavelength of 350 to 450 nm.

5. The hologram recording material according to claim 1, which further comprises a photopolymerization initiator.

6. A hologram recording medium having a hologram recording layer comprising the hologram recording material according to claim 5.

7. The hologram recording medium according to claim 6, wherein record/reproduction of said hologram recording medium are performed using a laser light having a wavelength of 350 to 450 nm.

8. A hologram recording medium having a hologram recording layer comprising the hologram recording material according to claim 1.

9. The hologram recording medium according to claim 8, wherein record/reproduction of said hologram recording medium are performed using a laser light having a wavelength of 350 to 450 nm.

10. A process for producing a hologram recording material comprising:
    a metal oxide containing at least Si and Zr as metals wherein a β-dicarbonyl compound is coordinated to Zr; and
    a photopolymerizable compound,
    the process comprising:
    mixing an alkoxide compound of Zr as a starting material with a β-dicarbonyl compound to set a mole ratio of the

TABLE 1

|  | Zr alkoxide | EtAcAc/ Zr alkoxide (mole ratio) | Si/Zr (mole ratio) | Dynamic Range M/# (Converted Value on 1 mm thickness) | Light Transmittance of Medium | Thickness of Recording Layer |
|---|---|---|---|---|---|---|
| Comparative Example 1 | Zr(O-nBu)4 | 1.95/1 | 1.0/1 | 6.4 | 60.0% | 330 μm |
| Comparative Example 4 | Zr(O-tBu)4 | 2.00/1 | 1.0/1 | 8.1 | 61.0% | 380 μm |
| Example 1 | Zr(O-nBu)4 | 2.25/1 | 1.1/1 | 24.0 | 68.8% | 340 μm |
| Comparative Example 3 | Zr(O-nBu)4 | 2.30/1 | 0.93/1 | 6.6 | 72.5% | 360 μm |
| Example 2 | Zr(O-nBu)4 | 2.50/1 | 1.1/1 | 20.6 | 78.6% | 290 μm |
| Example 3 | Zr(O-nBu)4 | 2.80/1 | 1.1/1 | 17.6 | 76.0% | 330 μm |
| Comparative Example 2 | Zr(O-nBu)4 | 3.30/1 | 1.1/1 | 14.0 | 78.2% | 300 μm |
| Comparative Example 5 | Ti butoxide | — | — | 11.4 | 31.0% | 390 μm |

β-dicarbonyl compound to the Zr atom (β-dicarbonyl compound/Zr ratio) to 2.2/1 or more and 2.8/1 or less, thereby modifying the alkoxide compound of Zr with the β-dicarbonyl compound;

mixing the alkoxide compound of Zr modified with the β-dicarbonyl compound with an alkoxide compound of Si to set a mole ratio of the Si atom to the Zr atom (Si/Zr ratio) to more than 1/1 and 1.15/1 or less;

hydrolyzing the mixed alkoxide compounds to yield a precursor of a metal oxide;

incorporating a photopolymerizable compound into the resultant system before, during or after the hydrolysis; and advancing a polycondensation reaction of the metal oxide precursor into which the photopolymerizable compound is incorporated.

11. The process for producing the hologram recording material according to claim 10, wherein the alkoxide compound of Zr as the starting material is a Zr alkoxide compound represented by:

$$Zr(OR)_n \qquad (I)$$

wherein R's are each a linear saturated alkyl group having 3 to 4 carbon atoms, and n is 4.

* * * * *